United States Patent Office 3,201,239

Patented Aug. 17, 1965

3,201,239
ETCHABLE REPRODUCTION COATINGS ON METAL SUPPORTS

Wilhelm Neugebauer, Wiesbaden-Biebrich, Fritz Endermann, Wiesbaden, and Maximilian Karl Reichel, Wiesbaden-Biebrich, Germany, assignors, by mesne assignments, to Azoplate Corporation, Murray Hill, N.J.

No Drawing. Filed Sept. 1, 1960, Ser. No. 53,357
Claims priority, application Germany, Sept. 4, 1959, K 38,624
16 Claims. (Cl. 96—36)

Light-sensitive coatings are disclosed in German Patent 938,233, which, because of the high degree of light-sensitivity thereof and the good adherence thereof to metal supports, e.g., aluminum or zinc, are of very great interest for the prepartion of printing plates for planographic and offset printing. The light-sensitive compounds used in these light-sensitive coatings are naphthoquinone-(1,2)-diazide-(2)-sulfonic acid esters corresponding to one of the general formulae

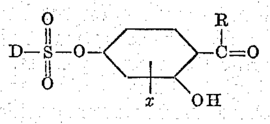

or

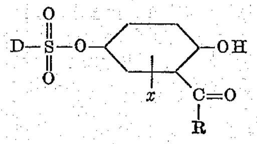

in which D is a naphthoquinone-(1,2)-diazide radical, $x$ is hydrogen or hydroxyl, R is hydrogen, $OR_1$, $NR_2R_3$, or a substituted or unsubstituted alkyl, aryl or heterocylic radical, $R_1$ is alkyl or aryl, and $R_2$ and $R_3$, which may or may not be identical, are hydrogen, alkyl, or aryl radicals.

When R is aryl, it may be substituted by, e.g. alkyl, halogens, alkoxy, aryloxy and naphthoquinone-(1,2)-diazide sulfonyl hydroxy radicals.

Exemplary of the compounds of the invention are the following:

FORMULA 1

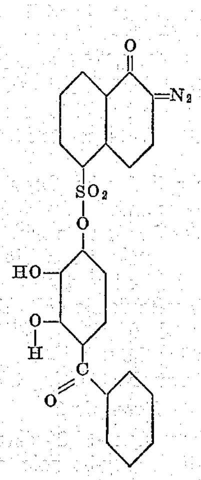

FORMULA 2

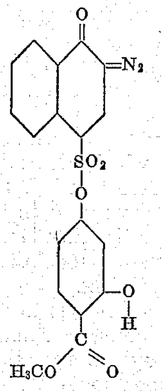

FORMULA 3

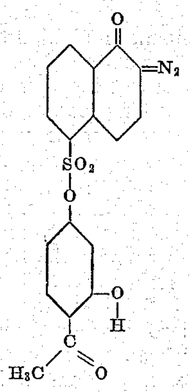

FORMULA 4

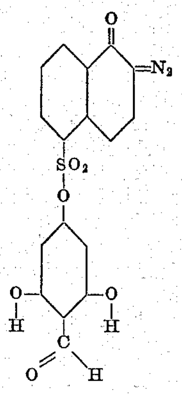

FORMULA 5

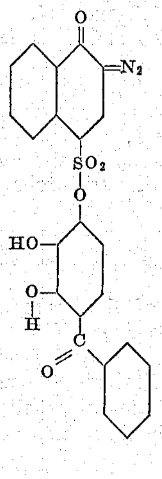

Other exemplary compounds are disclosed in copending application Serial No. 553,392, filed December 15, 1955.

If it is desired, by the employment of the light-sensitive aromatic diazo compounds previously known, to prepare etchable reproduction material for chemigraphic processes, from which, for example, relief or intaglio printing surfaces for book printing or illustration printing, printing plates consisting of line etchings or autotype etchings or bimetal and trimetal plates for planographic and offset printing may be made, it is found that the reproduction coatings, which are satisfactory for general planographic and offset printing, are not suitable, because the resistance thereof to the strong mineral acid etching solutions used in chemigraphic processes, e.g., dilute nitric acid, dilute hydrochloric acid, ferric chloride solutions, etc., is insufficient.

The present invention relates to etchable reproduction coatings on metal supports, particularly for chemigraphic processes, prepared by the use, as light-sensitive compounds, of naphthoquinone-(1,2)-diazide-(2)-sulfonic acid esters of the chemical constitution of the general formulae above. The etchable reproduction coatings of the invention contain, in addition to the light-sensitive naphthoquinone-(1,2)-diazide-(2)-sulfonic acid esters, alkali-soluble acid-resistant resins in quantities such that in the reproduction coating the proportion of alkali-soluble resin is at least as great as the proportion of the light-sensitive compound. The non-hardening phenol-formaldehyde novolaks are exemplary of the alkali-soluble, acid-resistant resins which are used in the etchable reproduction coatings. Novolaks are commercially available, e.g., those known under the trademark Alnovol.

The quantity of resin present in the etchable reproduction coatings of the invention, in relation to the quantity of the diazo compound used, must be very high. The very high concentration of resin determines definite quantitative proportions which must be maintained between the resin and the diazo compound, because not only must the ready removability of those portions of the coating struck by light be retained but also the resistive power of the alkali-sensitive resin portion, one component of which may contain phenol groups, in those portions not struck by light.

The requirements for light-sensitive coatings which are simultaneously etch-resistant have not been met by the hitherto known diazo compounds in a measure such as to permit the practical exploitation of the system. It is, therefore, surprising that the aromatic diazo compounds corresponding to the general formulae above should, when combined in certain proportions with acid-resistant alkali-soluble resins, be suitable for the preparation of etch-resistant light-sensitive coatings and hence for the preparation of printing surfaces for relief or intaglio printing.

The proportions to be maintained between aromatic diazo compound and resin are between 1:1 and 1:6, preferably between 1:2 and 1:4.

Metal plates and metal foils lend themselves with particular advantage to use as supports, e.g., those made of aluminum, lead, bronze, chromium, copper, magnesium, brass, silver, steel or zinc, as well as bimetal and trimetal foils, e.g., those consisting of copper and steel, aluminum and copper, and aluminum, copper and chromium. Also, dielectric foils with laminated or vapor-deposited metal coatings can be used as supports, preferably those consisting of transparent plastics, e.g., biaxially stretched and heat-fixed foils of polyterephthalic acid glycol esters.

The preparation of the reproduction material with the reproduction coatings of the invention adherent thereto is effected in manner known per se. The naphthoquinone-(1,2)-diazide-(2)-sulfonic acid ester or esters, of the constitution given above, are dissolved together with the alkali-soluble, acid-resistant resin in organic solvents and the solution, which contains the two components characterizing the reproduction coating, is coated upon the support by one of the commonly used coating processes, e.g., by the whirl-coating process, brushing, or roller application, and is then dried. Suitable solvents for the preparation of the coatings are, for example, glycol monomethylether or glycol monoethylether, aliphatic esters such as glacial acetic acid or butyl acetate, aliphatic ketones such as methylisobutyl ketone or acetone, or mixtures of such solvents. The quantity of diazo compound in the coating solutions is usually in the range of about 2 to 5 percent by weight. It is preferably between 2.5 and 3 percent.

Further, plasticizers, e.g., maize oil, mineral oil, castor oil, and sesame oil, may be added to the coating solutions in suitable proportions, i.e., from 0.1 to 0.5 percent. It is recommended that the photo-mechanically produced image, in order that it may be accurately examined, be colored with suitable dyestuffs, i.e., those characterized by low U.V. absorption. The dyestuff is best added to the light-sensitive coating solutions; suitable dyestuffs are, for example, Methyl Violet BB (Schultz' Farbstofftabellen, 7th edition, vol. I (1931), p. 327, No. 738), Rosaniline Hydrochloride (ibid., p. 324, No. 780), Methylene Blue (ibid., p. 449, No. 1038), and Patent Blue V (ibid., p. 349, No. 826).

The etch-resistant reproduction coatings of the invention are suitable both for the normal multi-stage etching process and for the single-stage process. A further advantage resides in the fact that, unlike the bichromate colloid coatings hitherto used in chemigraphic processes, this coating does not need to be burned in, before etching is effected, for satisfactory etch-resistance of the coating to be achieved. Thus, the original crystalline structure, e.g., of the zinc metal, is retained and there is no danger of the formation on the metal surface of the undesirable microscopically small bubbles which ruin a printing plate. The fact that the etch-resistant reproduction coatings of the invention are, unlike the bichromate colloid tanning layers hitherto used in chemigraphy, positive-working is an innovation which involves many advantages in the phototechnical preparation of line and screen masters and results in a true simplification in preparation and a qualitative improvement of printing plates for relief and intaglio printing.

The invention will be further illustrated by reference to the following specific examples:

*Example 1*

3 g. of 2,3,4-trihydroxy-benzophenone-naphthoquinone-(1,2)-diazide-(2)-5-sulfonic acid ester (Formula 1) and 10 g. of m-cresol-formaldehyde resin novolak, e.g., 10 g. of the product commercially available under the trademark Alnovol 429 K, are dissolved in a mixture of 80 ml. of glycol monomethylether and 20 ml. of butyl acetate. 0.3 g. of maize oil and 0.3 g. of Methyl Violet BB are added. The solution is filtered and then coated, by means of a spray nozzle, upon a rotating copper cylinder. The coating on the cylinder is dried and then exposed to light under a negative photographic master. The portions of the coating struck by the light are then removed using a cotton pad soaked in a 10–15 percent trisodium phosphate solution.

After the copper cylinder has been thus treated, it is washed over with water and then with 2–3 percent hydrochloric acid to remove the alkaline-reacting residues of the developer solution. After again rinsing with water, it is dried in hot air. The bared copper surface is then etched to the desired depth with ferric chloride solution of 40° Bé. at a temperature of 20° C. A relief printing surface is obtained which, after the usual chrome plating process, is excellently suited for the printing of transparent foils.

*Example 2*

3 g. of naphthoquinone-(1,2)-diazide-(2)-4-sulfonic acid ester of 2,4-dihydroxy-benzoic acid methyl ester (Formula 2) are dissolved, together with 10 g. of m-cresol-formaldehyde resin novolak (see Example 1) in 100 ml. of glycol monomethylether. 0.3 g. of castor oil and 0.5 g. of Methyl Violet BB are added. The solution is filtered and coated, e.g., by means of a whirler, upon a clean, polished zinc plate. The coating is dried in hot air. For the preparation of a printing block, the coated side of the zinc plate is exposed under a diapositive and the exposed coating is treated with a cotton pad soaked in a 2.5 percent trisodium phosphate solution containing 10–15 percent by volume of glycol monomethylether. The portions of the coating struck by light are removed from the zinc surface while the portions which were protected during exposure remain on the metal support as a residual image. The developed plate, after being rinsed with water, is deep-etched, in a stone trough provided with rotors, with dilute 7–8 percent nitric acid, either by the usual multistage process or by the newer single-stage process. Without the necessity of heating the zinc plate before etching, a printing block having surface excellently suited for book printing is obtained. Instead of the zinc plate, a magnesium plate can be used with equally good results.

*Example 3*

3 g. of 4-naphthoquinone-(1,2)-diazide-(2)-5-sulfonic acid ester of 2,4-dihydroxy-acetophenone (Formula 3) and 10 g. of m-cresol-formaldehyde resin novolak (see Example 1) are dissolved in 100 ml. of glycol monomethylether. 0.3 g. of sesame oil and 0.5 g. of Methyl Violet BB are added, the solution is filtered, and then coated, by means of a whirler, upon a smooth-polished zinc plate. For the preparation of zinc autotypes, the light-sensitive zinc plate is exposed to light under color-separation screen diapositive masters and the portions of the coating struck by light are removed with a 2.5 percent trisodium phosphate solution containing 10–15 percent by volume of glycol monomethylether, in a cotton pad. The zinc surface thus bared is etched with dilute nitric acid. Zinc autotype blocks, with correct color values, excellently suited for multicolor illustration work and book printing are obtained.

Instead of the zinc plate, a magnesium plate can be used with equal success.

*Example 4*

3 g. of naphthoquinone-(1,2)-diazide-(2)-5-sulfonic acid ester of 2,4,6-trihydroxy benzaldehyde (Formula 4) and 5 g. of m-cresol-formaldehyde resin novolak are dissolved in a mixture of 80 ml. of glycol monomethylether and 20 ml. of glycol monoethylether. 0.3 g. of sesame oil and 0.5 g. of Rosaniline Hydrochloride are added, the solution is filtered, and then whirl-coated upon a bimetallic foil consisting of aluminum and copper. After the coated metal foil has been exposed to light under a diapositive, the exposed parts of the coating are removed by treatment with a cotton pad soaked in a 2.5 percent (approx.) trisodium phosphate solution and the bared copper surface is etched away with ferric nitrate solution containing 160 g. of $Fe(NO_3)_3.9H_2O$ in 100 ml. of water. A printing plate for planographic and offset printing is obtained with which very long runs can be obtained. Instead of aluminum and copper, copper and steel can be used for the bimetal foil with equal success.

*Example 5*

3 g. of 4-naphthoquinone-(1,2)-diazide-(2)-4-sulfonic acid ester of 2,3,4-trihydroxy-benzophenone (Formula 5) and 5 g. of m-cresol-formaldehyde resin novolak (see Example 1) are dissolved in 100 ml. of glycol monomethylether. 0.2 g. of castor oil and 0.5 g. of Rosaniline Hydrochloride are added, the solution is filtered, and then coated upon a trimetallic foil consisting of aluminum, copper and chromium layers. The coated trimetallic foil is exposed to light under a photographic negative and the exposed foil is then treated with a 2.5 percent (approx.) trisodium phosphate solution, containing additionally 10–15 percent by volume of glycol monomethylether, to remove the parts of the coating struck by light. The developed foil is then rinsed down with water and dried in hot air. Etching of the bared chromium surface is effected with a mixture of calcium chloride, hydrochloric acid and glycerine. The copper surface under the chromium layer is not attacked by this solution. A printing surface for planographic and offset printing is obtained in which the printing elements consist of copper and the non-printing portions of chromium.

*Example 6*

The process described in Example 5 is carried out but as a support a copper foil of a thickness of 30–70$\mu$ is used and is laminated to a dielectric plastic plate, e.g., a plate consisting of a hardened phenol-formaldehyde resin or polyvinyl chloride which is free of plasticizer or contains only very little plasticizer. After the light-sensitive material has been exposed under a diapositive showing a wiring scheme and the portions of the coating struck by light have been removed by treatment with a 2.5 percent (approx.) trisodium phosphate solution, containing additionally 10–15 percent by volume of glycol monomethylether, the plate consisting of copper and plastic is rinsed down with water and dried in hot air. Then, the copper surface is etched in the bared portions with ferric chloride solution of 40° Bé. at room temperature and a printed circuit for the conduction of electric current is obtained.

Instead of the plate made of copper and plastic, a transparent, dielectric foil of polyterephthalic acid glycol ester to which a metal coating, e.g., of aluminum or copper, has been applied, either by lamination or by vacuum deposition, can be used with particular advantage. The etching solutions used for this latter foil contain the following chemicals, per liter—

For the copper-laminated foil:

271 g. of calcium chloride,
262 g. of ferric chloride (commercial quality $FeCl_3$),
7.2 ml. of 80 percent nitric acid,
14.5 ml. of concentrated hydrochloric acid, and
5.9 g. of cupric chloride.

For the foil with vacuum-deposited metal coating:

452 g. of calcium chloride,
54 g. of ferric chloride (commercial quality $FeCl_3$),
12 ml. of 80 percent nitric acid,
24 ml. of concentrated hydrochloric acid, and
7.5 g. of cupric chloride ($CuCl_2.2H_2O$).

Printed circuits for the conduction of electric current are obtained which are particularly suitable as components in the construction of electrical apparatus.

It will be obvious to those skilled in the art that many modifications may be made within the scope of the present invention without departing from the spirit thereof, and the invention includes all such modifications.

What is claimed is:

1. A light-sensitive material comprising a metallic base material having a coating thereon comprising a non-hardenable, alkali-soluble, acid resistant novolak resin and a light sensitive compound, the resin being present in a quantity, by weight, at least equivalent to that of the light sensitive compound, the latter having the formula

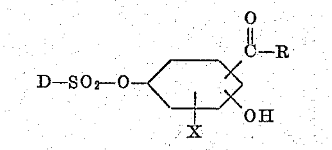

in which D is a naphthoquinone-(1,2)-diazide radical, X is selected from the group consisting of hydrogen and hydroxyl and R is selected from the group consisting of hydrogen, alkyl, aryl, alkoxy, aryloxy, amino, and heterocyclic groups.

2. A presensitized printing plate according to claim 1 in which the light sensitive compound has the formula

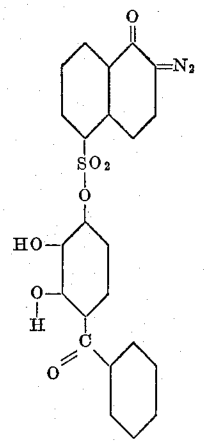

3. A presensitized printing plate according to claim 1 in which the light sensitive compound has the formula

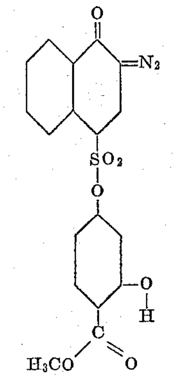

4. A presensitized printing plate according to claim 1 in which the light sensitive compound has the formula

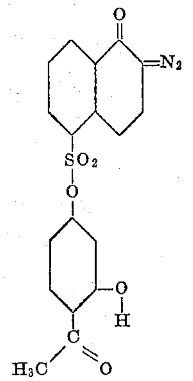

5. A presensitized printing plate according to claim 1 in which the light sensitive compound has the formula

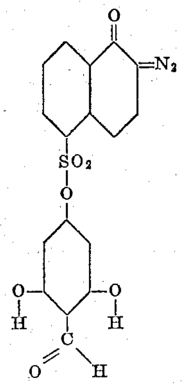

6. A presensitized printing plate according to claim 1 in which the light sensitive compound has the formula

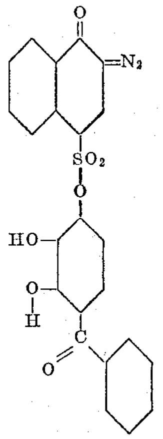

7. A process for making a printing plate which comprises exposing a coated metallic base material to light under a master, the coating comprising a non-hardenable, alkali-soluble, acid resistant novolak resin and a light sensitive compound, the resin being present in a quantity, by weight, at least equivalent to that of the light sensitive compound, the latter having the formula

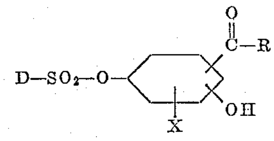

in which D is a naphthoquinone-(1,2)-diazide radical, X is selected from the group consisting of hydrogen and hydroxyl and R is selected from the group consisting of hydrogen, alkyl, aryl, alkoxy, aryloxy, amino, and heterocyclic groups, treating the exposed coating with a weakly alkaline developing solution to remove those portions of the coating struck by light, and etching the bared metallic surface.

8. A process according to claim 7 in which the light sensitive compound has the formula

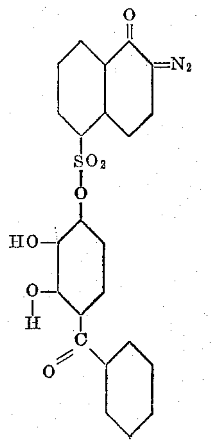

9. A process according to claim 7 in which the light sensitive compound has the formula

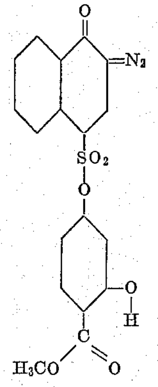

10. A process according to claim 7 in which the light sensitive compound has the formula

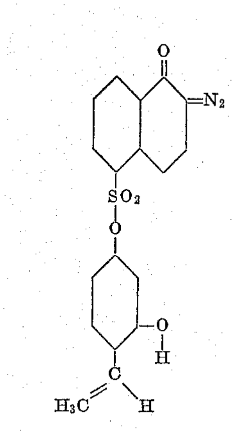

11. A process according to claim 7 in which the light sensitive compound has the formula

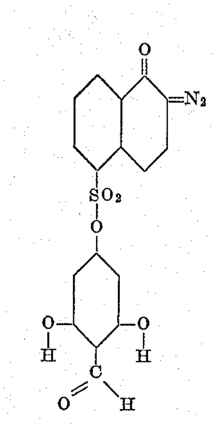

12. A process according to claim 7 in which the light sensitive compound has the formula

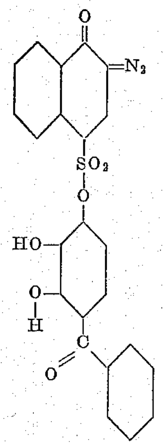

13. A light-sensitive material according to claim 1 in which the alkali-soluble, acid resistant resin is present in is present in an amount of from about 1 part by weight to about 6 parts by weight for each part by weight of light sensitive substance contained in the coating.

14. A light-sensitive material according to claim 1 in which the alkali-soluble, acid resistant resin is present in an amount of from about 2 to about 4 parts by weight for each part by weight of light sensitive substance contained in the coating.

15. A process for making a printing plate according to claim 7 in which the alkali soluble, acid resistant resin is present in an amount of from about 1 part by weight to about 6 parts by weight for each part by weight of light sensitive substance contained in the coating.

16. A process for making a printing plate according to claim 7 in which the alkali soluble, acid resistant resin is present in an amount of from 2 to 4 parts by weight for each part by weight of light sensitive substance contained in the coating.

References Cited by the Examiner

UNITED STATES PATENTS

| | | | |
|---|---|---|---|
| 2,754,209 | 7/56 | Schmidt et al. | |
| 2,995,442 | 8/61 | Schmidt et. al. | |
| 3,050,387 | 8/62 | Neugebauer et al. | |
| 3,061,430 | 10/62 | Uhlig et al. | |
| 3,130,047 | 4/64 | Uhlig et al. | 96—33 |
| 3,130,048 | 4/64 | Fritz | 96—33 |

FOREIGN PATENTS

| | | |
|---|---|---|
| 581,020 | 8/59 | Canada. |
| 706,028 | 3/54 | Great Britain. |
| 711,626 | 7/54 | Great Britain. |
| 739,654 | 11/55 | Great Britain. |
| 744,987 | 2/56 | Great Britain. |

NORMAN G. TORCHIN, *Primary Examiner.*

MILTON STERMAN, PHILIP E. MANGAN, *Examiners.*

UNITED STATES PATENT OFFICE

CERTIFICATE OF CORRECTION

Patent No. 3,201,239 August 17, 1965

Wilhelm Neugebauer et al.

It is hereby certified that error appears in the above numbered patent requiring correction and that the said Letters Patent should read as corrected below.

Column 7, lines 1, 21, 40 and 58, and column 8, line 1, for "presensitized printing plate", each occurrence, read -- light-sensitive material --; column 10, line 24, strike out "in is present".

Signed and sealed this 22nd day of February 1966.

(SEAL)
Attest:

ERNEST W. SWIDER
Attesting Officer

EDWARD J. BRENNER
Commissioner of Patents